(12) United States Patent
Takagi et al.

(10) Patent No.: US 6,174,796 B1
(45) Date of Patent: Jan. 16, 2001

(54) SEMICONDUCTOR DEVICE MANUFACTURING METHOD

(75) Inventors: Hideo Takagi; Wataru Futo, both of Kanagawa (JP)

(73) Assignee: Fujitsu Limited, Kawasaki (JP)

( * ) Notice: Under 35 U.S.C. 154(b), the term of this patent shall be extended for 0 days.

(21) Appl. No.: 09/223,280

(22) Filed: Dec. 30, 1998

(30) Foreign Application Priority Data

Jan. 30, 1998 (JP) .................................................. 10-019244

(51) Int. Cl.[7] .................................................. H01L 21/4763
(52) U.S. Cl. ............................................ 438/622; 438/622
(58) Field of Search .................................... 438/637, 638, 438/639, 640, 675, 672, 756, 228, 700, 704, 974, 622

(56) References Cited

U.S. PATENT DOCUMENTS 5,420,078 * 5/1995 Sikora ................................... 438/640
5,968,851 * 10/1999 Geha et al. .......................... 438/756

* cited by examiner

Primary Examiner—David Nelms
Assistant Examiner—David Nhu
(74) Attorney, Agent, or Firm—Armstrong, Westerman, Hattori, McLeland & Naughton

(57) ABSTRACT

A semiconductor device manufacturing method having a copper wiring, comprises the steps of forming a second insulating film for covering the wiring on a first insulating film, forming a third insulating film which is made of material different from the second insulating film on the second insulating film, coating a resist on the third insulating film and then forming an opening over the wiring by exposing and developing the resist, forming a hole or groove in the third insulating film by etching the third insulating film via the opening, removing the resist by placing the semiconductor substrate in a plasma atmosphere containing oxygen in a chamber and simultaneously removing a part of the second insulating film via the hole or groove to expose the wiring via the hole or groove, and forming a metal film in the hole or groove.

18 Claims, 7 Drawing Sheets

SEMICONDUCTOR DEVICE MANUFACTURING METHOD

BACKGROUND OF THE INVENTION

1. Field of the Invention

The present invention relates to a semiconductor device manufacturing method and, more particularly, a method of manufacturing a semiconductor device to which copper wirings are provided.

2. Description of the Prior Art

In case a copper wiring is formed on the semiconductor device, a damascene method of embedding copper in a groove or hole formed in an insulating film is employed.

As a method of embedding the copper in the groove or hole, there are a method of forming a copper film in the groove (or hole) by sputter, a method of removing an unnecessary copper film by polishing after the copper film is grown on the insulating film and in the groove (or hole) by plating method or chemical vapor deposition, etc.

Then, an example of a method of embedding the copper in the hole will be explained with reference to FIGS. 1A to 1D hereinbelow.

As shown in FIG. 1A, first a insulating film 102 is formed on a silicon substrate 101, then a second insulating film 103 is formed on the insulating film 102, then a groove 104 is formed in the second insulating film 103, then a copper film is formed in the groove 104, and then the unnecessary copper film is removed by polishing, whereby the copper film remained in the groove 104 can be employed as a wiring 105.

After this, a silicon nitride film 106 is formed on the second insulating film 103 and the wiring 105, and then an interlayer insulating film 107 made of silicon oxide is formed on the silicon nitride film 106. Then, the interlayer insulating film 107 is patterned by the photolithography, so that a via hole 108 is formed over the wiring 105.

As the etching method of the via hole 108, for example, the interlayer insulating film 107 made of silicon oxide is selectively etched by the high density plasma by using the ICP (Inductive Coupled Plasma) equipment to reach the silicon nitride film 106. In other words, under the condition that the silicon nitride film 106 can function as the etching stopper, a part of the interlayer insulating film 107 is etched.

Then, as shown in FIG. 1B, the silicon nitride film 106 exposed from the via hole 108 is selectively etched, whereby a part of the wiring 105 is exposed from the via hole 108.

Then, as shown in FIG. 1C, a titanium nitride (TiN) barrier layer 109 is formed on the interlayer insulating film 107 and an inner surface of the via hole 108 by sputtering.

In turn, as shown in FIG. 1D, a copper film 110 is formed on the TiN barrier layer 109 by the electrolytic plating method while using the TiN barrier layer 109 as an electrode.

In this case, the first insulating film 102 is a local oxidation of silicon (LOCOS) film employed for device isolation, for example, and the second insulating film 103 is the interlayer insulating film for covering a semiconductor device formed on the silicon substrate 101.

However, if the TiN barrier layer 109 is formed by sputtering, the TiN barrier layer 109 is overhung over the via hole 108, as shown in FIG. 1C, to thus narrow a diameter of an opening of the via hole 108. As a result, a void 111 is caused in a copper film (plug) 110 in the via hole 108 shown in FIG. 1D, so that electric resistance of the copper film 110 in the via hole 108 is enhanced.

In order to eliminate such overhang, as shown in FIG. 2A, for example, there has been known the method in which the interlayer insulating film 107 is placed in the argon plasma atmosphere before the TiN barrier layer 109 is formed, to form an inclined surface on an upper peripheral edge of the via hole 108.

According to this method, as shown in FIG. 2B, since a surface of the wiring 105 is attacked by argon, copper constituting the wiring 105 is spread out to stick onto a side wall of the via hole 108, so that the copper is diffused into the interlayer insulating film 107. Therefore, resistance of copper diffusion portions is lowered to thus cause short-circuit of the wirings.

The interlayer insulating film 107 is etched by the ICP plasma etching equipment in forming the via hole 108. However, in order to prevent etching of the silicon nitride film 106, a carbon compound gas is employed as the etching gas. In this case, since the ICP plasma etching equipment can generate the high density plasma, polymer is stuck onto the inside of the chamber because of reaction of the carbon compound gas. As a result, shortening of the cleaning cycle of the chamber is caused.

SUMMARY OF THE INVENTION

It is an object of the present invention to provide a semiconductor device manufacturing method capable of reducing a resistance of a copper plug embedded in a via hole when the via hole is formed in an interlayer insulating film, and also suppressing contamination of an inside of a chamber when the interlayer insulating film is etched.

In order to achieve the above object, according to an aspect of the present invention, there is provided a semiconductor device manufacturing method comprising the steps of forming a wiring on a first insulating film which is formed on a semiconductor substrate, forming a second insulating film for covering the wiring, forming a third insulating film which is made of material different from the second insulating film on the second insulating film, coating a resist on the third insulating film and then forming an opening over the wiring by exposing and developing the resist, forming a hole or groove in the third insulating film by etching the third insulating film via the opening by virtue of a reactive ion etching method, removing the resist, forming an inclined surface by etching an upper edge portion of the third insulating film around the hole or groove to thus extend an upper portion of the hole or groove, removing a part of the second insulating film via the hole or groove by the reactive ion etching method, and forming a metal film in the hole or groove.

According to the present invention, the wiring is formed on the first insulating film, then the second insulating film and the third insulating film for covering the wiring are formed, then the hole or the groove is formed in the third insulating film, and then an inclined surface is formed by etching the upper edge of the third insulating film around the hole or groove while covering the wiring with the second insulating film to thus extend the hole or groove.

Hence, since the wiring is protected by the second insulating film in etching, such wiring is not etched. Therefore, constituent material of the wiring can be prevented from being stuck onto the third insulating film.

After the hole or groove has been extended, the wiring is exposed by etching the second insulating film via the hole or groove by means of the reactive ion etching. In this case, the metal constituting the wiring is never stuck onto the side wall of the hole or groove and also a higher density of the plasma can be suppressed, so that polymer formation in the chamber can be reduced.

Accordingly, reduction in the resistance value of the third insulating film serving as the side wall of the hole or groove can be avoided. In addition, since the upper portion of the hole or groove can be widened in diameter, the event that the void is generated in the metal in which the hole or groove is formed later can be prevented.

According to an aspect of the present invention, there is provided a semiconductor device manufacturing method comprising the steps of forming a wiring on a first insulating film which is formed on a semiconductor substrate, forming a second insulating film for covering the wiring, forming a third insulating film which is made of material different from the second insulating film on the second insulating film, coating a resist on the third insulating film and then forming an opening over the wiring by exposing and developing the resist, forming a hole or groove in the third insulating film by etching the third insulating film via the opening, removing the resist by placing the semiconductor substrate in a plasma atmosphere containing oxygen in a chamber and simultaneously removing a part of the second insulating film via the hole or groove to expose the wiring via the hole or groove, and forming a metal film in the hole or groove.

According to another invention, removal of the resist being employed in forming the hole or groove and removal of the second insulating film via the hole or groove are executed simultaneously by using the oxygen containing plasma. For this reason, since the wiring is exposed to the oxygen plasma in etching the second insulating film, such wiring becomes difficult to be etched because the surface of the second wiring is oxidized. As a result, sticking of the metal of the wiring onto the side wall becomes difficult.

Since the upper edge of the third insulating film constituting the side wall of the hole or groove can be etched by introducing the inert gas such as argon, etc. into the oxygen containing plasma, the upper portion of the hole or groove can be extended.

In addition, if the oxygen containing plasma is employed, the advantage of cleaning the inside of the chamber can also be achieved.

DESCRIPTION OF THE PREFERRED EMBODIMENTS

Embodiments of the present invention will be explained with reference to the accompanying drawings hereinafter.

(First Embodiment)

FIGS. 3A to 3H are sectional views showing steps of manufacturing a semiconductor device according to a first embodiment of the present invention.

Figure 1A:
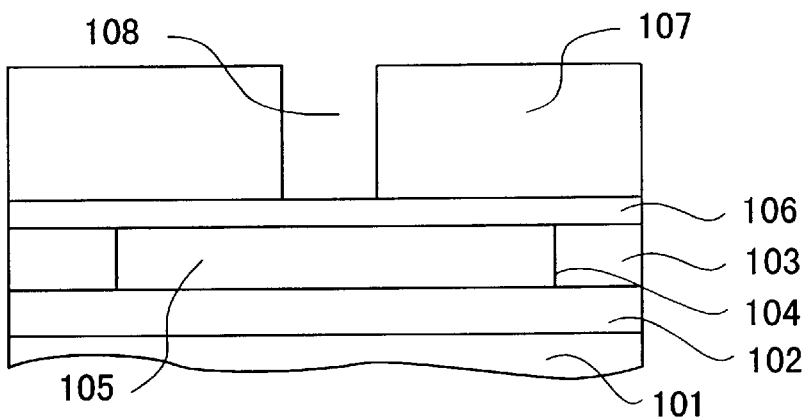
FIGS. 1A to 1D are sectional views showing an example of plug formation in the prior art.
Figure 1B:
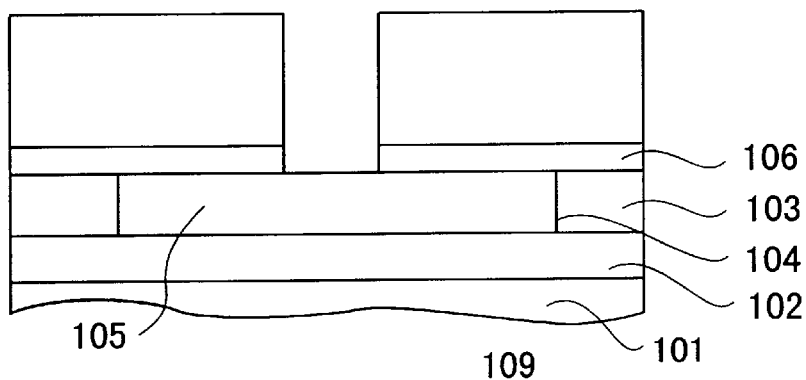
Figure 1C:
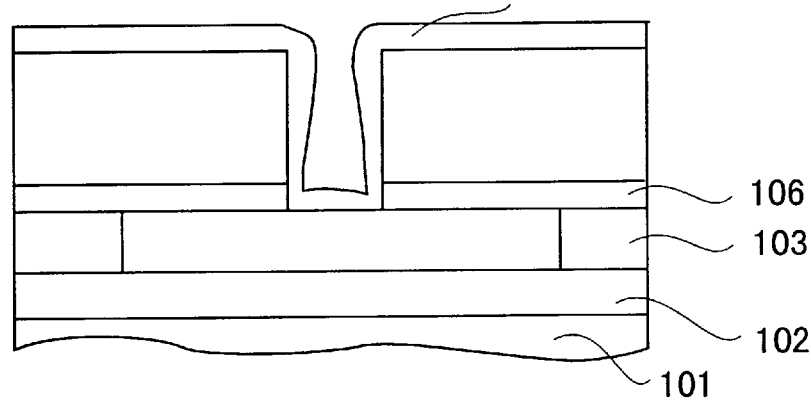
Figure 1D:
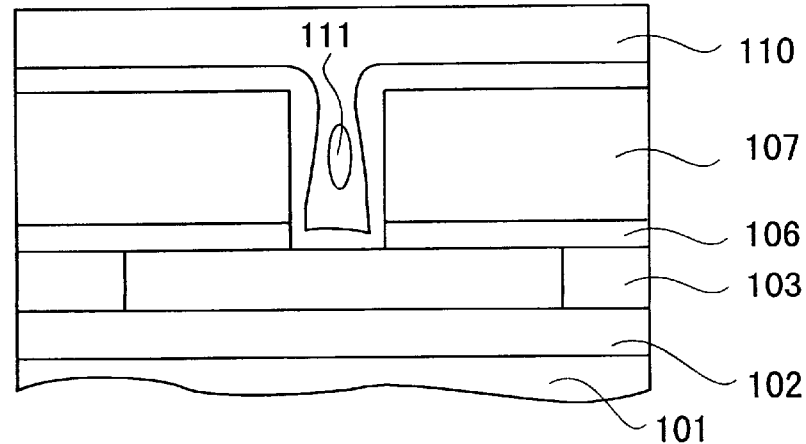
Figure 2A:
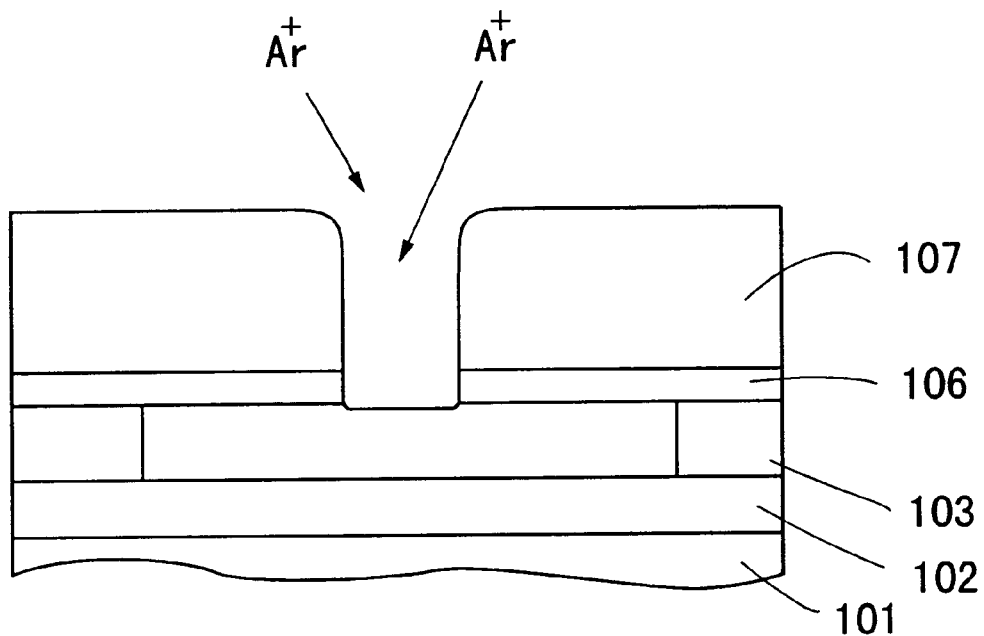
FIGS. 2A and 2B are sectional views showing steps of expanding an upper portion of a via hole in the prior art.
Figure 2B:
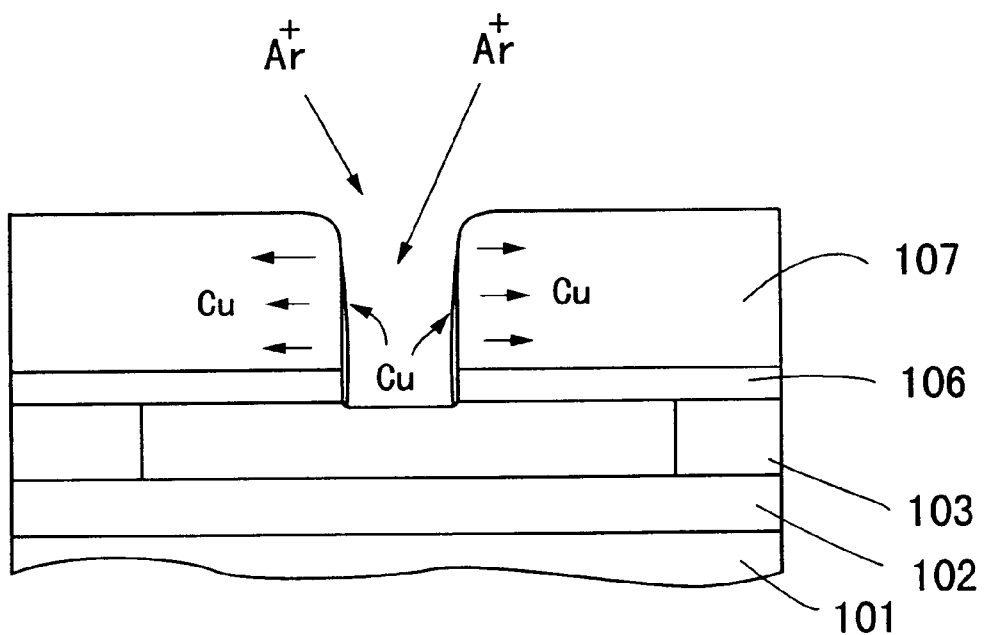
Figure 3A:
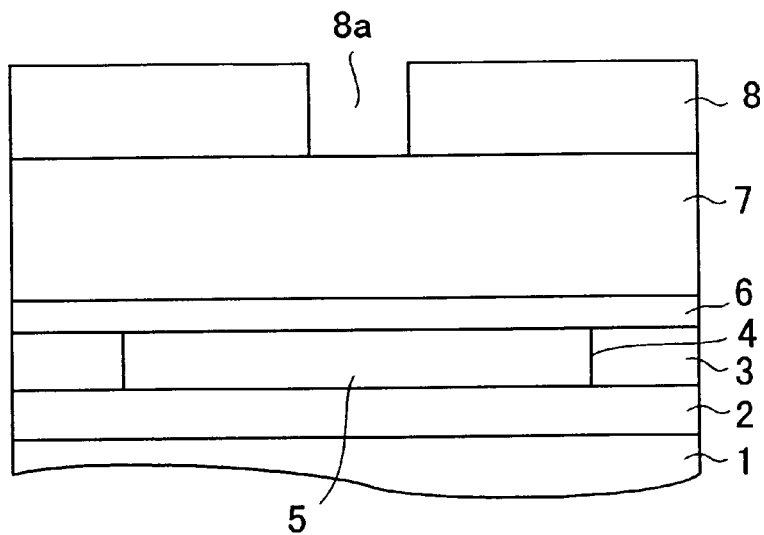
FIGS. 3A to 3H are sectional views showing steps of manufacturing a semiconductor device according to a first embodiment of the present invention.

To begin with, as shown in FIG. 3A, a first insulating film 2 and a second insulating film 3 are formed of a silicon substrate (semiconductor substrate) 1. The first insulating film 2 is a field oxide film, for example, which is formed on a surface of the silicon substrate 1 by the selective oxidation method. The second insulating film 3 is an SiO2 film, for example, which covers a semiconductor device such as a transistor formed on the silicon substrate 1.

A groove 4 is formed in the second insulating film 3 by the photolithography method. A wiring 5 made of copper is formed in the groove 4 by the damascene method.

In addition, a silicon nitride film 6 and an interlayer insulating film 7 are formed on the second insulating film 3 and the wiring 5 in order by the plasma CVD method. The interlayer insulating film 7 is made of silicon oxide ($SiO_2$) group material such as BPSG (borophosphosilicate glass), PSG (phososilicate glass), BSG (borosilicate glass), etc., silicon dioxide, and other low dielectric constant material.

A film thickness of the silicon nitride film 6 is set to about 50 nm. The interlayer insulating film 7 is grown to have a thickness of 1000 nm and then thinned up to 750 nm by polishing after growth.

A resist 8 is coated on the interlayer insulating film 7 to a thickness of 0.7 $\mu$m. A via opening portion 8a of a diameter of 0.3 $\mu$m is formed by exposing and developing the resist 8.

Figure 3B:
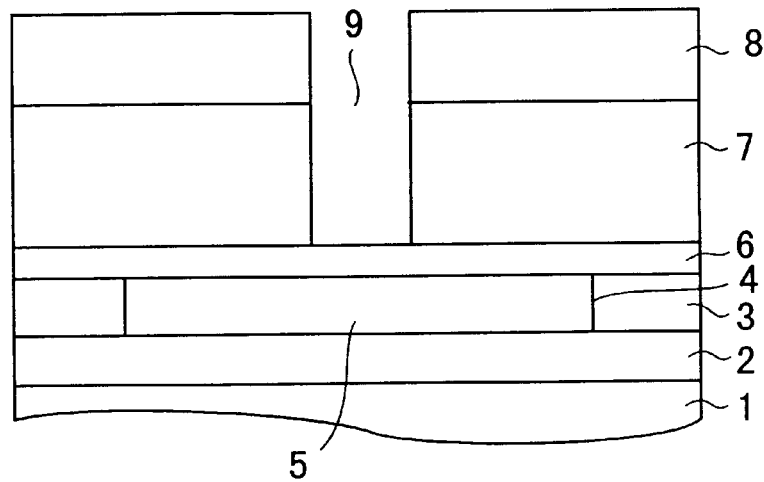

Then, the interlayer insulating film 7 is etched partially via the via opening portion 8a by the reactive ion etching (RIE) method by using the resist 8 as a mask, to thus form a via hole 9 of a diameter of 0.3 $\mu$m, as shown in FIG. 3B.

In etching, the ICP plasma equipment (not shown) is employed. As etching conditions, $C_4F_8$, $CH_2F_2$, and Ar are introduced into the chamber at a flow rate of 15 sccm, 10 sccm, 150 sccm as the reaction gas respectively, the substrate temperature is set to 10° C., the pressure in the chamber is set to 5 mTorr, the ICP supply power is set to 2000 W, the bias power is set to 900 W, and the etching time is set to 70 seconds.

Figure 3C:
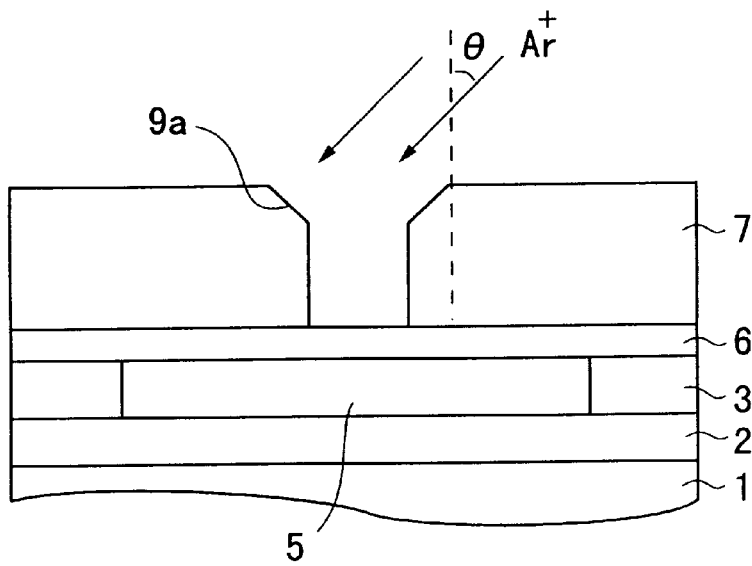

Then the resist 8 is removed by the solvent, then the silicon substrate 1 is loaded into the chamber of the sputter etching equipment (not shown), and then an argon gas is generated in the low pressure atmosphere whose inner pressure is set to 0.5 mTorr. As shown in FIG. 3C, argon ions are irradiated to the interlayer insulating film 7 at an angle of 30 to 60 degrees, preferably almost 45 degree, relative to a perpendicular line to an upper surface of the silicon substrate 1. Thus, a corner of the interlayer insulating film 7 which defines an upper edge of the via hole 9 is cut off to thus form an inclined surface 9a. As a result, an upper area of the via hole 9 can be extended.

Since the wiring 5 made of copper is shielded from the etching atmosphere by the silicon nitride film 6 in sputter etching, the copper wiring 5 is never etched and therefore the copper is never stuck onto the side wall of the via hole 9.

Figure 3D:
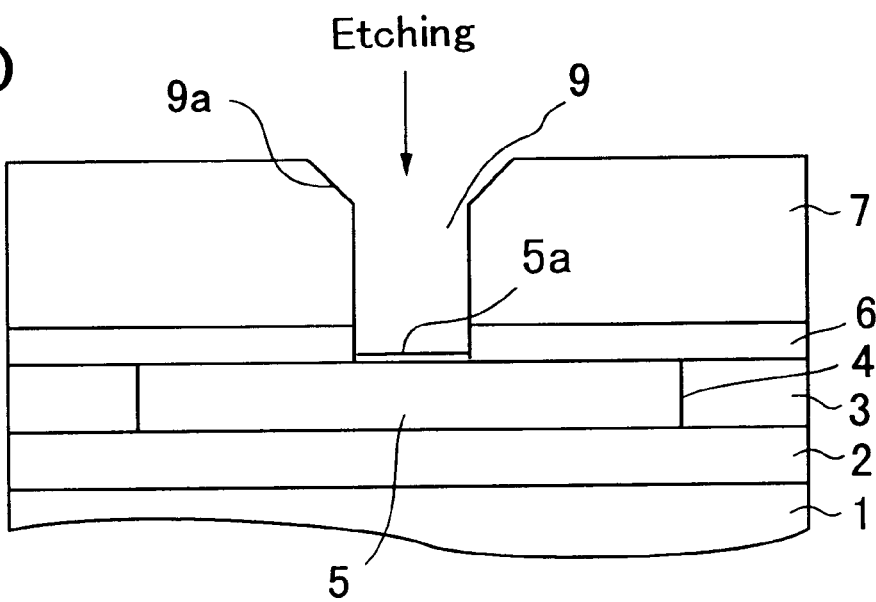

Then, as shown in FIG. 3D, a part of the silicon nitride film 6 is removed via the via hole 9 by the reactive ion etching method to expose a part of the wiring 5 from the via hole 9.

In etching, for example, $CF_4$, $CHF_3$, and Ar are introduced into the plasma atmosphere at a flow rate of 15 sccm, 15 sccm, 400 sccm as the reaction gas respectively, the substrate temperature is set to about 0° C., and the pressure in the etching atmosphere is set to about 500 mTorr.

After this, the step of forming a metal film will be carried out. As the pretreatment, a copper oxide formed on a surface of the wiring 5 made of copper is removed by the method described in the following.

First, the via hole 9 and the wiring 5 are immersed in an oxygen fluoride solution of a 1 to 0.1% concentration for about 10 seconds. Then, the silicon substrate 1 is held in the hydrogen gas atmosphere of 50 to 500 mTorr within 48 hours, then the substrate temperature is set to 200 to 400° C., and then annealing is carried out for three minutes, whereby the copper oxide on the surface of the wiring 5 can be removed.

Figure 3E:
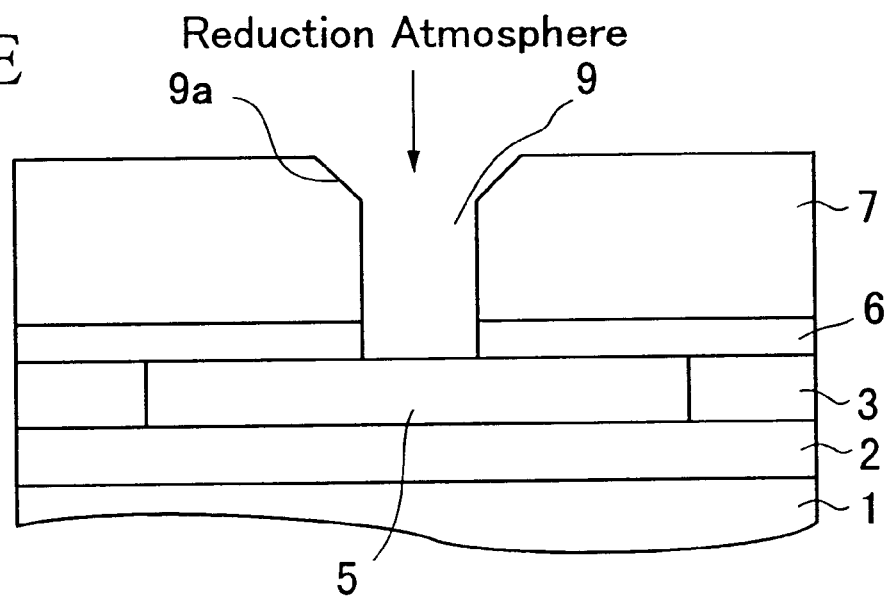

Then, as shown in FIG. 3E, the silicon substrate 1 is loaded in the pretreatment chamber of the cluster equipment employed to form the metal film, and then the substrate is annealed at 200 to 400° C. in the atmosphere of 1 to 500 mTorr, into which hydrogen ($H_2$) of 80 flow rate % and argon (Ar) of 20 flow rate % are introduced, so that the copper oxide formed on the surface of the wiring 5 can be removed. In place of this method, such a method may be employed that first the silicon substrate 1 is loaded in the atmosphere of 1 to 500 mTorr, into which hydrogen ($H_2$) of 80 flow rate % and argon (Ar) of 20 flow rate % are introduced, by using the ICP plasma equipment, and then the copper oxide formed on the surface of the wiring 5 is removed by reduction plasma. During above removal of the copper oxide, ammonia may be added to the gas.

If the copper oxide 5a is removed by the above method, the copper is in no way stuck onto the side wall of the via hole 9.

Figure 3F:
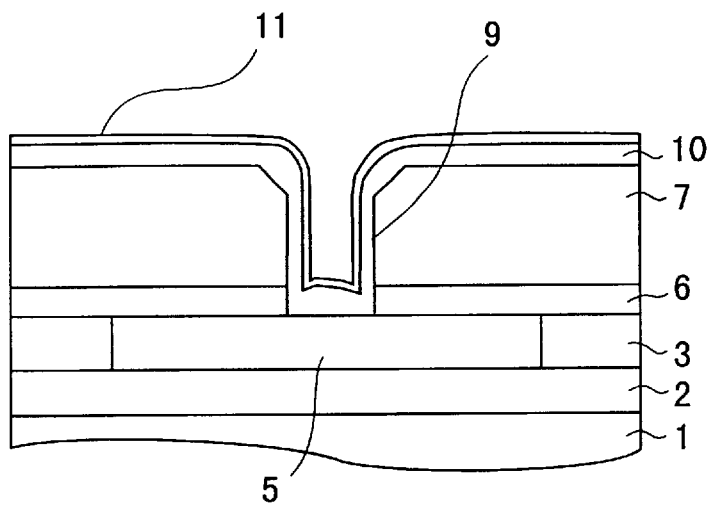
Figure 3G:
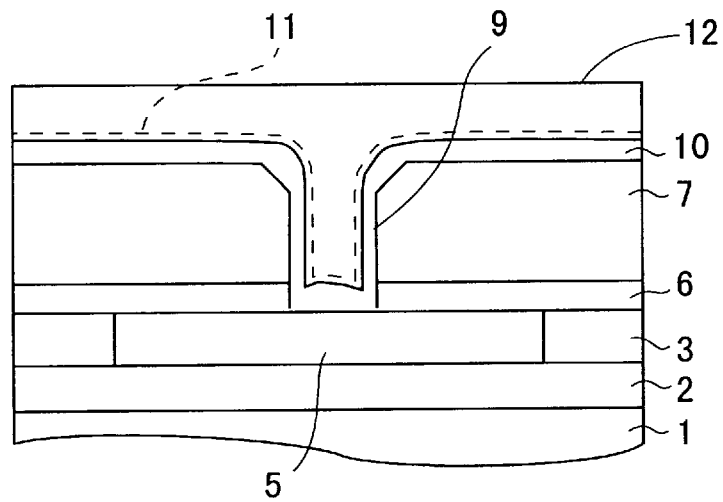

After such removal of the copper oxide 5a has been executed, the silicon substrate 1 is loaded into the sputter film forming equipment or the CVD film forming equipment without exposure to the outer air. Then, as shown in FIG. 3F, a barrier metal layer 10 is formed on an inner surface of the via hole 9 and the interlayer insulating film 7 to a thickness of 10 to 50 nm by the sputter method or the CVD method. The barrier metal layer 10 is made of refractory metal compound such as titanium nitride, tantalum nitride, tantalum, tungsten nitride, etc. Then, a first copper film 11 is formed on the barrier metal layer 10 by the sputter method, the CVD method, or the electroless plating. The first copper film 11 acts as a seed metal film.

The achievable degree of vacuum of the sputter equipment is $9 \times 10^{-8}$ Torr. In sputtering etching, the pressure of the argon gas is set to 0.3 mTorr, and the applied power to the sputter electrode is set to 12 kW.

Such seed metal film (10, 11) tends to be formed thick on the upper edge of the via hole 6 along the lateral direction. However, since the via hole 6 is retreated or extended outward by the inclined surface 9a, the seed metal film (10, 11) can be formed not to overhang toward the inside of the via hole 6.

Then, as shown in 3G, by the electrolytic plating method using the barrier metal 10 and the first copper film 11 as an electrode, a second copper film 12 is formed on the first copper film 11 to a thickness of 1.5 μm. In this case, since the upper portion of the via hole 9 is extended, no void is generated in the second copper film 12 formed in the via hole 9.

The pulse plating method is employed as the electrolytic plating method. As conditions of the pulse plating method, for example, sulfuric acid bath (plating solution) is employed, and a pulse current of 2.5 A/cm² is supplied to the electrodes at a time interval of 10 msec. A growth rate of the second copper film 12 is set to about 1.8 μm/min, for example.

Connection of the second copper film 12 and the wiring 5 via the via hole 9 can be improved by removing the above copper oxide.

In this case, even if the second copper film 12 is formed by the sputter method or the CVD method in place of the electrolytic plating method, the via hole 9 can be also buried well by the second copper film 12.

Figure 3H:
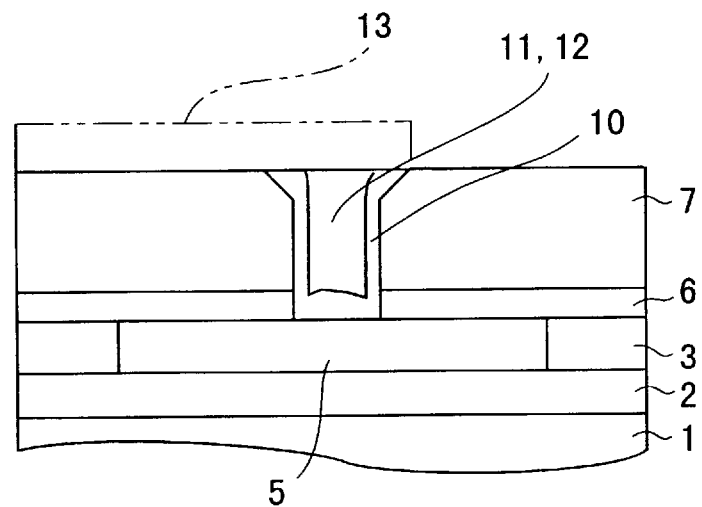

Then, as shown in FIG. 3H, the first copper film 11, the second copper film 12, and the barrier metal layer 10 are polished continuously by the chemical mechanical polishing method, so that the copper film 11 on the interlayer insulating film 7 can be removed. Then, the first copper film 11, the second copper film 12, and the barrier metal layer 10 left in the via hole 9 may be employed as a plug.

As the conditions of the chemical mechanical polishing method, for example, material containing $Al_2O_3$ is employed as slurry, the evolution number of the silicon substrate 1 is set to 20 to 160 rpm, the revolution number of a platen which opposes to the first copper film 11 and the second copper film 12 is set to 40 to 160 rpm, and the pad pressure applied to the first copper film 11 and the second copper film 12 is set to 250 g/cm².

Then, an upper wiring 13 is formed on the interlayer insulating film 7 and then connected to the plug 10, 11, 12 in the via hole 9. Otherwise, the upper wiring 13 may be formed by the damascene method, or the upper wiring 13 may be formed by forming the aluminum film and then patterning the aluminum film by virtue of the photolithography method.

If the above interlayer insulating film 7 is formed of an organic group SOG, low dielectric constant material containing $SiO_2$ or C (carbon) is formed instead of the silicon nitride film 6, whereby the interlayer insulating film 7 can be selectively etched.

The above copper embedding method may be carried out in forming the copper wiring in the groove of the insulating film. In addition, the above plug and the upper wiring 13 may be formed simultaneously by the so-called dual damascene method. In such case, the above method may be employed. Further, as the metal film constituting the plug or the wiring, metal material such as palladium (Pd), etc., which is ready to diffuse into the insulating film, may be employed in place of copper.

(Second Embodiment)

A method of performing concurrently formation of the via-hole, removal of the resist, formation of the inclined surface on the upper portion of the via hole, and cleaning of the inside of the chamber, which are performed separately in the first embodiment, will be explained in the following.

At first, after the structure shown in FIG. 3B has been formed, the silicon substrate 1 is placed in the atmosphere in which a gas containing an inert gas such as argon, helium, or the like and oxygen ($O_2$) is plasmanized.

Figure 4A:
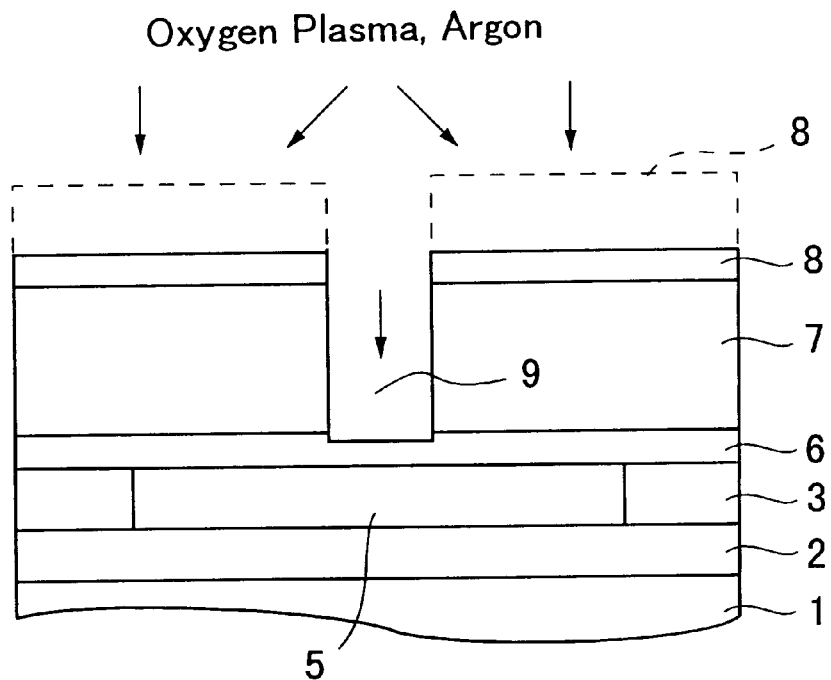
FIGS. 4A and 4B are sectional views showing steps of manufacturing a semiconductor device according to a second embodiment of the present invention.

Next, as shown in FIG. 4A, ashing of the resist 8 made of organic material is carried out by using the oxygen plasma, and at the same time the silicon nitride film 6 is physically etched by the argon contained in the plasma.

In the initial stage of the etching of the silicon nitride film 6, the copper wiring 5 is covered with the silicon nitride film 6. Therefore, the copper is never spread out from the wiring 5 and thus the copper can be prevented from being stuck onto the side wall of the via hole 9.

In the final stage of the etching of the silicon nitride film 6, the surface of the wiring 5 is oxidized by the oxygen plasma. Therefore, the copper is not stuck onto the side wall of the via hole 9 and thus diffusion of the copper into the interlayer insulating film 7 can be prevented.

Figure 4B:
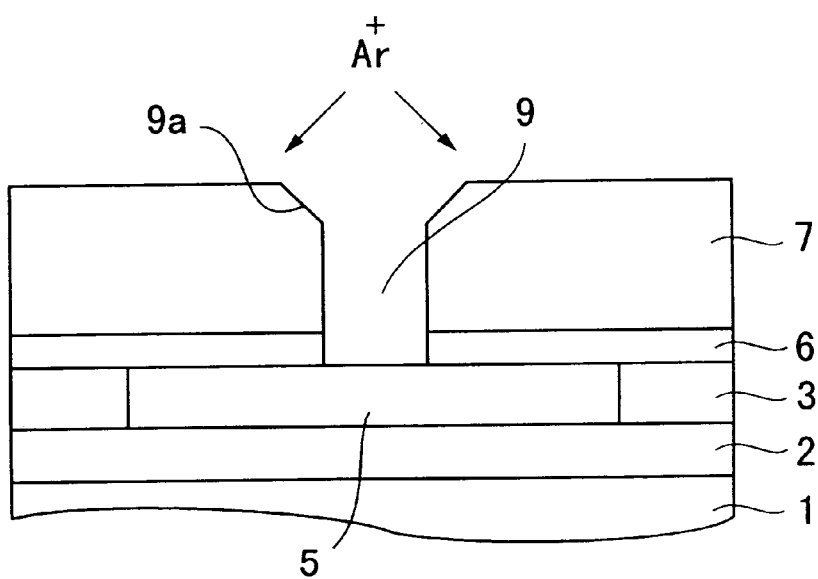

The interlayer insulating film 7 being exposed by removing the resist 8 is etched physically by the argon. Since this etching is isotropic etching, the upper edge portion of the interlayer insulating film 7 which defines the via hole 9 is etched. Thus, as shown in FIG. 4B, the upper edge portion of the via hole 9 is shaped as the inclined surface 9a. Since etching of the interlayer insulating film 7 is started after ashing of the resist 8 has been finished, merely the interlayer insulating film 7 is slightly etched.

For example, the parallel plate type equipment is employed as the plasma etching equipment to generate the above mixed gas plasma, and flow rates of the oxygen gas and the argon gas are set to about 100 sccm and 10 sccm respectively. The pressure of the plasma generating atmosphere is set to 5 mTorr, the substrate temperature is set to 10° C., and the power applied to the electrode is set to 200 W. Under these conditions, the inclined surface 9a is formed from the top end of the via hole 9 to a depth of 100 nm.

According to the above conditions, since not only the polymer is never stuck onto the inner surface of the chamber of the plasma etching equipment but also cleaning of the inner surface of the chamber is effected, time and labor required for the cleaning can be reduced.

After this, as shown in FIG. 3E, the wiring 5 made of copper is placed in the reduction atmosphere to remove the oxide on the surface of the wiring 5, and then the process advances to the succeeding steps shown in FIG. 3F.

Figure 5:
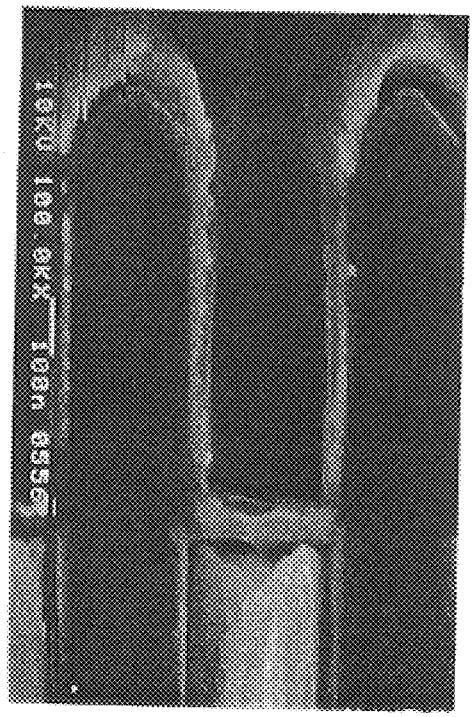
FIG. 5 is a SEM photograph showing a titanium nitride film formed on the via hole according to the embodiments of the present invention.
Figure 6:
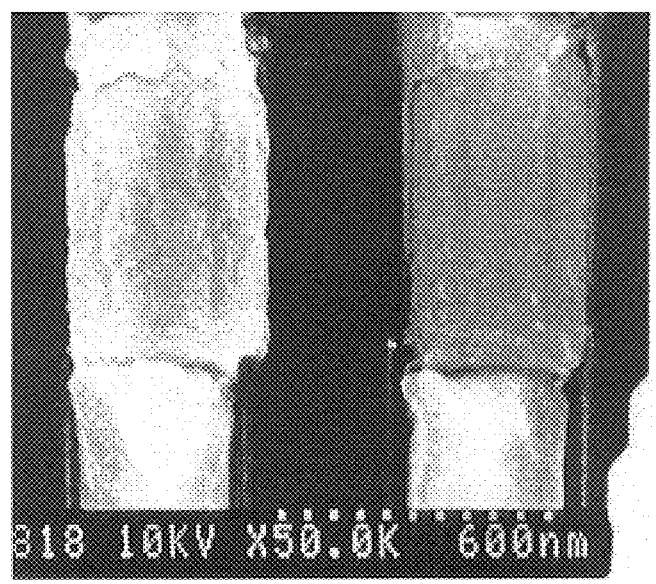
FIG. 6 is a SEM photograph showing a plug formed in the via hole and a wiring formed on the plug according to the embodiments of the present invention.

Next, a SEM sectional photograph showing a wiring structure which corresponds to FIG. 3F shown in the above two embodiments can be depicted in FIG. 5. Similarly, a SEM sectional photograph showing a wiring structure which corresponds to FIG. 3H can be depicted in FIG. 6.

In this event, if a diameter of the bottom portion of the via hole 9 is set to 0.3 μm, a resistance value of the plug formed in the via hole 9 becomes 0.5 Ω, which yield the good result.

As described above, according to the present invention, the wiring is formed on the first insulating film, then the second insulating film and the third insulating film for covering the wiring are formed, then the hole or the groove is formed in the third insulating film, and then an inclined surface is formed by etching the upper edge of the third insulating film around the hole or groove while covering the wiring with the second insulating film to expand the hole or groove. As a result, the wiring is not etched since it is protected by the second insulating film in etching, so that constituent material of the wiring can be prevented from being stuck onto the third insulating film.

After the hole or groove has been extended, the wiring is exposed by etching the second insulating film via the hole or groove by means of the reactive ion etching. As a result, the metal can be prevented from being stuck onto the side wall of the hole or groove and in addition higher density of the plasma can be suppressed, so that polymer formation in the chamber can be reduced.

Accordingly, reduction in the resistance value of the third insulating film serving as the side wall of the hole or groove can be avoided, and also the upper portion of the hole or groove is widened in diameter. Hence, it can be prevented that the void is generated in the metal in which the hole or groove is formed later.

According to another invention, since removal of the resist being employed in forming the hole or groove, and removal of the second insulating film via the hole or groove are executed simultaneously by using the oxygen containing plasma, the wiring is exposed to the oxygen plasma in the final stage of the etching of the second insulating film, so that the wiring becomes difficult to be oxidized because the surface of the second wiring is oxidized. As a result, sticking of the metal of the wiring onto the side wall can be prevented by suppressing the scattering of the metal from the wiring.

Since the upper edge of the third insulating film constituting the side wall of the hole or groove can be etched by introducing the inert gas such as argon, etc. into the oxygen containing plasma, the upper portion of the hole or groove can be extended in diameter. In addition, if the oxygen containing plasma is employed, the advantage of cleaning the inside of the chamber can also be achieved.

What is claimed is:

1. A semiconductor device manufacturing method comprising the steps of:

forming a wiring on a first insulating film which is formed on a semiconductor substrate;

forming a second insulating film for covering the wiring;

forming a third insulating film, which is made of material different from the second insulating film, on the second insulating film;

coating a resist on the third insulating film, and then forming an opening over the wiring by exposing and developing the resist;

forming a hole or groove in the third insulating film by etching the third insulating film via the opening with a reactive ion etching method;

removing the resist;

forming an inclined surface by etching an upper edge portion of the third insulating film around the hole or groove to thus extend an upper portion of the hole or groove;

after forming the inclined surface, removing a part of the second insulating film via the hole or groove by the reactive ion etching method; and forming a metal film in the hole or groove.

2. A semiconductor device manufacturing method according to claim 1, wherein the inclined surface is formed by etching the third insulating film with argon sputtering.

3. A semiconductor device manufacturing method according to claim 1, further comprising the step of removing an oxide from a surface of the wiring by heating the surface of the wiring via the hole or groove in a hydrogen containing atmosphere.

4. A semiconductor device manufacturing method according to claim 1, further comprising the step of removing an oxide from a surface of the wiring by exposing the surface of the wiring to a hydrogen plasma atmosphere via the hole or groove.

5. A semiconductor device manufacturing method according to claim 1, further comprising the step of removing an oxide from a surface of the wiring by etching the surface of the wiring via the hole or groove by using hydrogen fluoride.

6. A semiconductor device manufacturing method according to claim 1, wherein the wiring is formed of copper or palladium.

7. A semiconductor device manufacturing method according to claim 1, wherein the second insulating film is formed of a silicon nitride film, and the third insulating film is formed of a silicon oxide containing film.

8. A semiconductor device manufacturing method according to claim 1, wherein the second insulating film is formed of low dielectric constant material which contains a silicon oxide or carbon, and the third insulating material is formed of low dielectric constant material which contains an organic group SOG.

9. A semiconductor device manufacturing method comprising the steps of:
   forming a wiring on a first insulating film which is formed on a semiconductor substrate;
   forming a second insulating film for covering the wiring;
   forming a third insulating film, which is made of material different from the second insulating film, on the second insulating film;
   coating a resist on the third insulating film, and then forming an opening over the wiring by exposing and developing the resist;
   forming a hole or groove in the third insulating film by etching the third insulating film via the opening;
   removing the resist by placing the semiconductor substrate in a plasma atmosphere containing oxygen in a chamber, and simultaneously removing a part of the second insulating film via the hole or groove to expose the wiring via the hole or groove; and
   forming a metal film in the hole or groove.

10. A semiconductor device manufacturing method according to claim 9, wherein an inert gas is supplied into the plasma atmosphere.

11. A semiconductor device manufacturing method according to claim 9, wherein an inclined surface is formed by etching an upper edge of the third insulating film being exposed by removing the resist in the plasma atmosphere to thus extend an upper portion of the hole or groove.

12. A semiconductor device manufacturing method according to claim 9, wherein an inner surface of the chamber is cleaned by the plasma atmosphere.

13. A semiconductor device manufacturing method according to claim 9, further comprising the step of removing an oxide from a surface of the wiring by heating the surface of the wiring via the hole or groove in a hydrogen containing atmosphere.

14. A semiconductor device manufacturing method according to claim 9, further comprising the step of removing an oxide from a surface of the wiring by exposing the surface of the wiring to a hydrogen plasma atmosphere via the hole or groove.

15. A semiconductor device manufacturing method according to claim 9, further comprising the step of removing an oxide from a surface of the wiring by etching the surface of the wiring via the hole or groove by using hydrogen fluoride.

16. A semiconductor device manufacturing method according to claim 9, wherein the wiring is formed of copper or palladium.

17. A semiconductor device manufacturing method according to claim 9, wherein the second insulating film is formed of a silicon nitride film, and the third insulating film is formed of a silicon oxide containing film.

18. A semiconductor device manufacturing method according to claim 9, wherein the second insulating film is formed of low dielectric constant material which contains a silicon oxide or carbon, and the third insulating material is formed of low dielectric constant material which contains an organic group SOG.

* * * * *